(12) United States Patent
Little

(10) Patent No.: US 11,462,851 B2
(45) Date of Patent: Oct. 4, 2022

(54) MACHINE CASE AND CABLE CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 17/237,431

(22) Filed: Apr. 22, 2021

(65) Prior Publication Data

US 2021/0336369 A1 Oct. 28, 2021

Related U.S. Application Data

(60) Provisional application No. 63/015,562, filed on Apr. 25, 2020.

(51) Int. Cl.
| H01R 13/405 | (2006.01) |
| H01R 13/502 | (2006.01) |
| H01R 12/62 | (2011.01) |
| H01R 24/60 | (2011.01) |
| H01R 13/52 | (2006.01) |

(52) U.S. Cl.
CPC ........... *H01R 13/405* (2013.01); *H01R 12/62* (2013.01); *H01R 13/502* (2013.01); *H01R 13/521* (2013.01); *H01R 24/60* (2013.01)

(58) Field of Classification Search
CPC ....... H02J 7/00; H01R 13/405; H01R 13/502; H01R 13/521; H01R 13/631; H01R 13/02; H01R 12/62; H01R 12/77; H01R 12/79; H01R 24/60; H05K 5/069
See application file for complete search history.

(56) References Cited

U.S. PATENT DOCUMENTS 9,698,545 B2 * 7/2017 Little .................... G06F 1/1632
10,238,338 B2 * 3/2019 McCombie .......... A61B 5/6826
(Continued)

*Primary Examiner* — Abdullah A Riyami
*Assistant Examiner* — Nader J Alhawamdeh
(74) *Attorney, Agent, or Firm* — Ming Chieh Chang

(57) ABSTRACT

A machine case includes a bottom cover and a top cover with a connection port, encloses a printed circuit board therein. An internal flat cable is equipped with a first connector at one end thereof and mounted upon a center region of the printed circuit board, and a second connector at another end thereof and disposed in the connection ports without electrically connecting to the printed circuit board. The second connector includes a plurality of contacts integrally formed within an insulator via insert-molding. A cable connector assembly includes an insulative housing having a mating port adapted to be mated with the connection port. A printed circuit board is embedded within the housing and forms mating pads on two opposite surfaces in a reversely symmetrical manner so as to have the two corresponding mating pads on two opposite surfaces in the diagonal direction share the same circuits.

12 Claims, 28 Drawing Sheets

(56) References Cited

U.S. PATENT DOCUMENTS

| | | | |
|---|---|---|---|
| 10,574,072 B2* | 2/2020 | Tagtow | H02J 7/342 |
| 10,886,651 B2* | 1/2021 | Tsai | H01R 12/62 |
| 2016/0141814 A1* | 5/2016 | Little | G06F 1/1632 |
| | | | 439/529 |
| 2016/0141819 A1* | 5/2016 | Chang | H01R 31/005 |
| | | | 439/529 |
| 2019/0115777 A1* | 4/2019 | Tagtow | H02J 7/342 |
| 2020/0036124 A1* | 1/2020 | Tsai | H01R 12/62 |
| 2021/0218183 A1* | 7/2021 | Chen | H01R 13/6205 |
| 2021/0336369 A1* | 10/2021 | Little | H01R 12/62 |

* cited by examiner

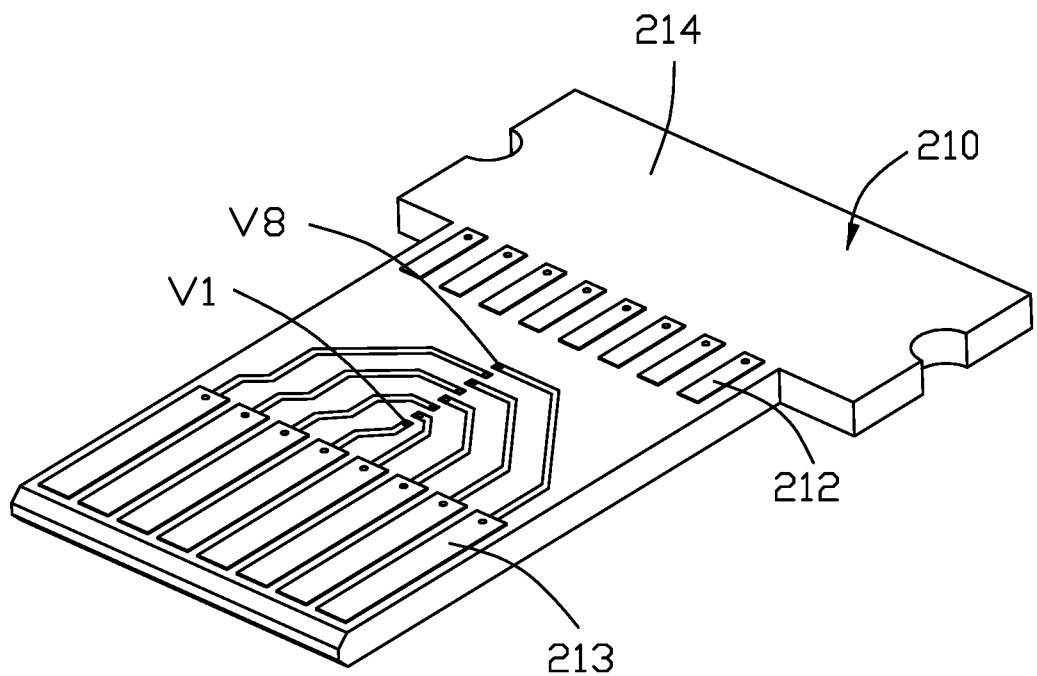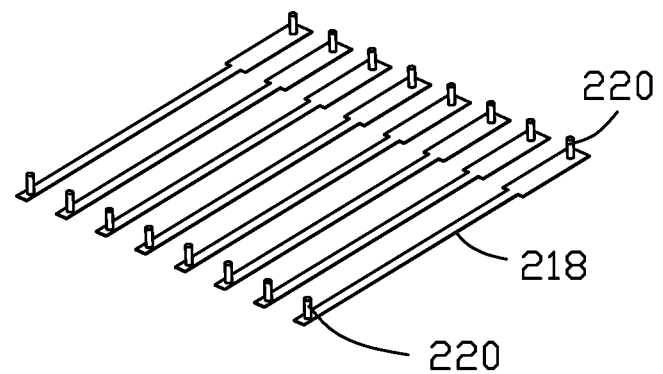
FIG. 27

MACHINE CASE AND CABLE CONNECTOR ASSEMBLY

CROSS REFERENCE TO RELATED APPLICATIONS

This application claims the benefit of, and priority to, U.S. Provisional Patent Application No. 63/015,562, filed Apr. 25, 2020, the contents of which are incorporated entirely herein by reference.

BACKGROUND OF THE INVENTION

1. Field of the Invention

The present invention relates generally to a cable assembly detachably attached to a machine case, and particularly to a waterproofing machine case and a flappable cable connector assembly adapted to be mated therewith.

2. Description of Related Arts

As disclosed in U.S. provisional application Nos. 62/959,886 filed on Jan. 11, 2020 and 62/899,156 filed on Sep. 12, 2019 and/or U.S. Pat. Nos. 9,722,375, 9,698,545, and 9,685,744, a machine case and the cable connector assembly mateable therewith are desired in the industry.

Anyhow, a waterproofing machine case and a flappable cable connector assembly mateable therewith, are desired.

SUMMARY OF THE INVENTION

To achieve the above object, a machine case comprises a first cover and a second cover commonly forming a receiving space, and at least two connection ports formed in the first cover to communicating with an exterior. An internal printed circuit board is retained in the second cover. A plurality of first connectors is mounted upon a center region of the printed circuit board. A plurality of second connectors is disposed in the corresponding connection ports, respectively, without directly connecting to the printed circuit board while indirectly connecting to the first connectors via corresponding internal cables, respectively.

To achieve the above object, a cable connector assembly adapted for mating with a machine case comprises an insulative housing and an internal mating printed circuit board retained in the insulative housing. The internal mating printed circuit board includes front mating pads on both opposite first and second surfaces, and rear connecting pads on at least one of said surfaces, a plurality of transmission layer units formed within the internal mating printed circuit board. The front mating pads on the first surface are transversely reversely symmetrical with regard to those on the second surface and commonly electrically connected to the same connecting pads, respectively, via same respective transmission layer units.

To achieve the above object, a machine case comprises a cover commonly forming an internal receiving space and a connector port communicating with an exterior, an internal printed circuit board retained in the internal receiving space, and an internal flat cable with a first connector at one end of the internal flat cable and mounted upon a center region of the printed circuit board, and a second connector at another end of the internal flat cable. The second connector is disposed in the connection port, the second connector including a plurality of contacts retained to an insulator via an insert-molding process for assuring waterproofing between the insulator and the contacts; the insulator is retained in the cover, each contact comprising a contacting section disposed in the connecting port, and a tail section soldered with the internal flat cables.

Other advantages and novel features of the invention will become more apparent from the following detailed description of the present embodiment when taken in conjunction with the accompanying drawings.

BRIEF DESCRIPTION OF THE DRAWING

FIG. 27 is an exploded perspective view of the mating printed circuit board of the cable connector assembly of FIG. 24.

DETAILED DESCRIPTION OF THE PREFERRED EMBODIMENT

Figure 1:
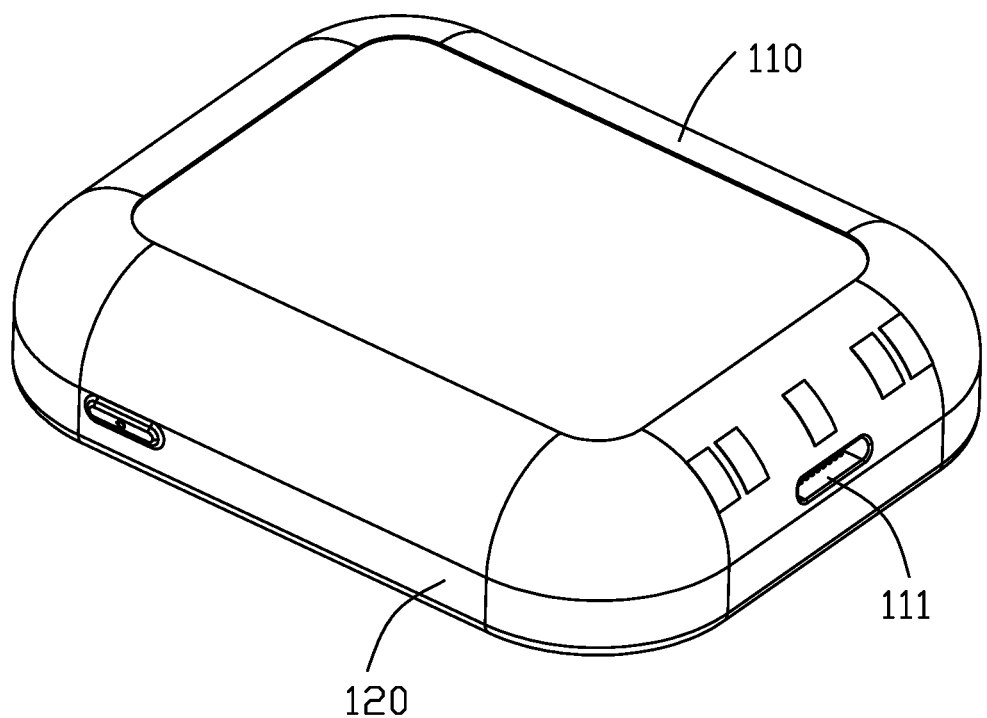
FIG. 1 is a perspective view of a machine case of the present invention.
Figure 2:
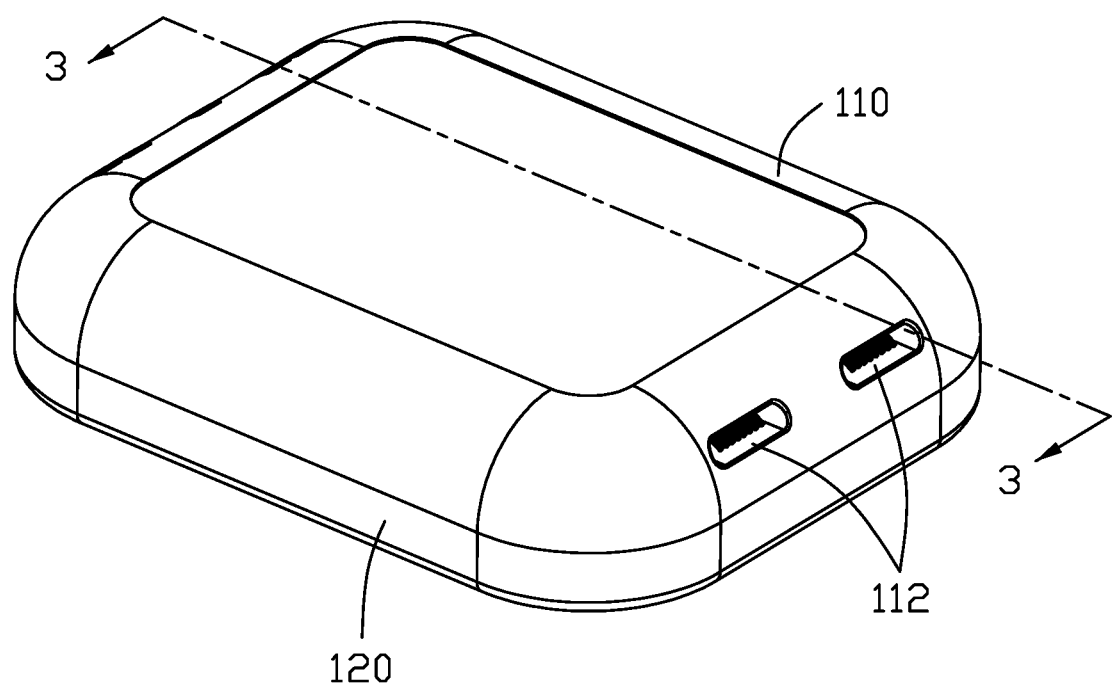
FIG. 2 is another perspective view of the machine case of FIG. 1.
Figure 3:
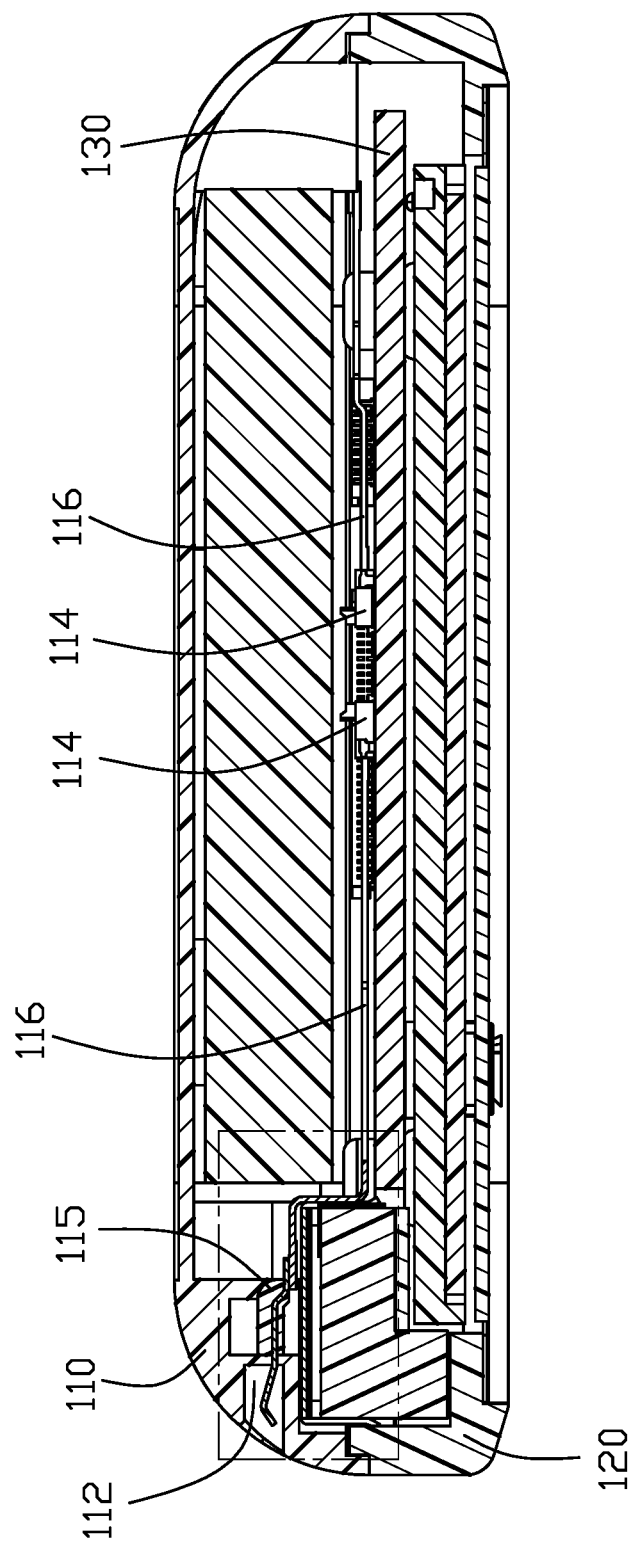
FIG. 3 is a cross-sectional view of the machine case taken along broken lines 3-3 in FIG. 1.
Figure 4:
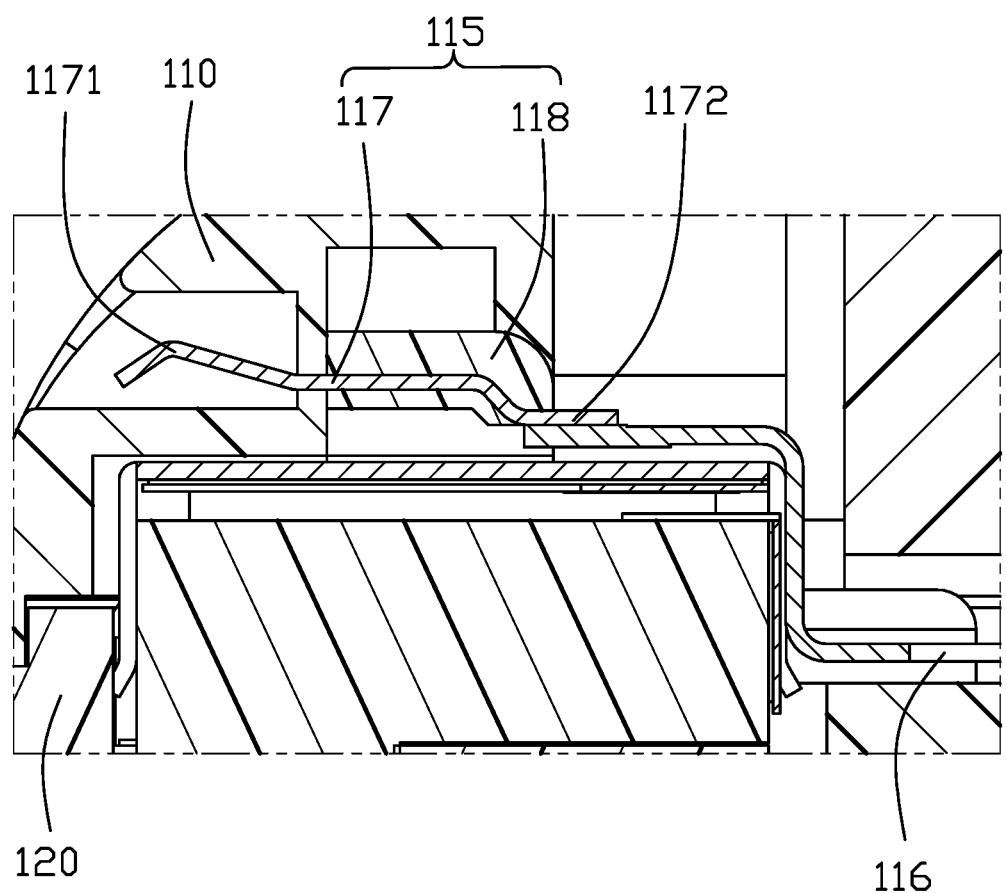
FIG. 4 is an enlarged cross-sectional view of a portion of the machine case of FIG. 3.
Figure 5:
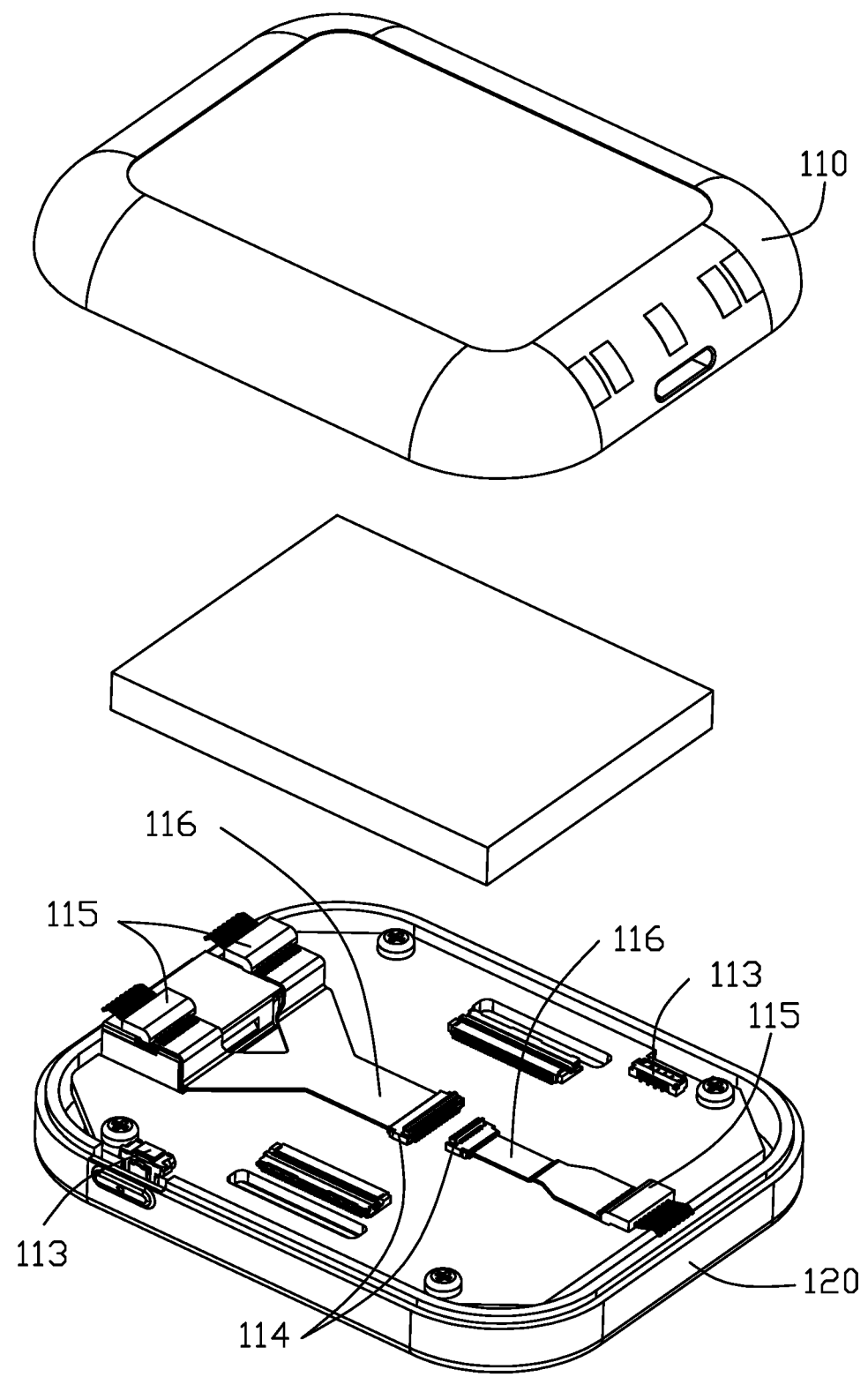
FIG. 5 is an exploded perspective view of the machine case of FIG. 1.
Figure 6:
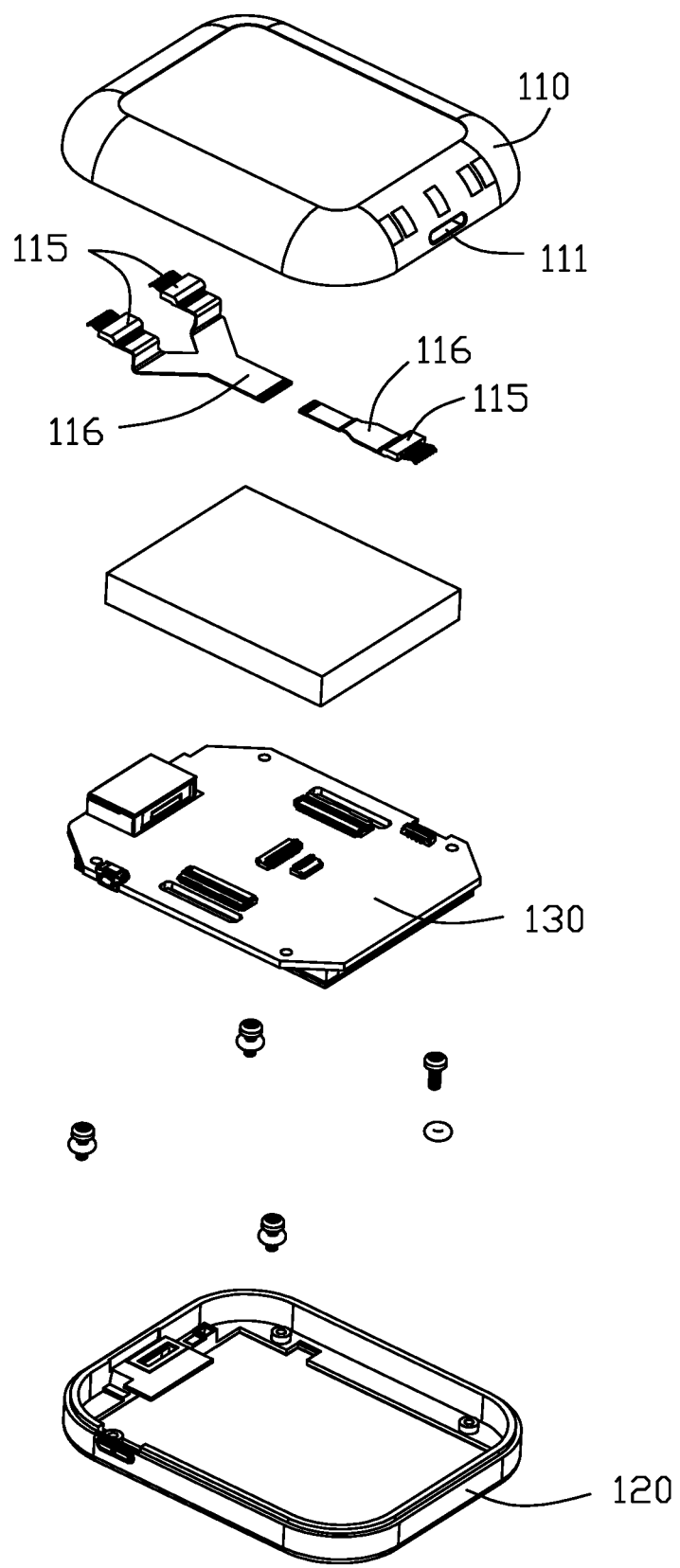
FIG. 6 is a further exploded perspective view of the machine case of FIG. 5.
Figure 7:
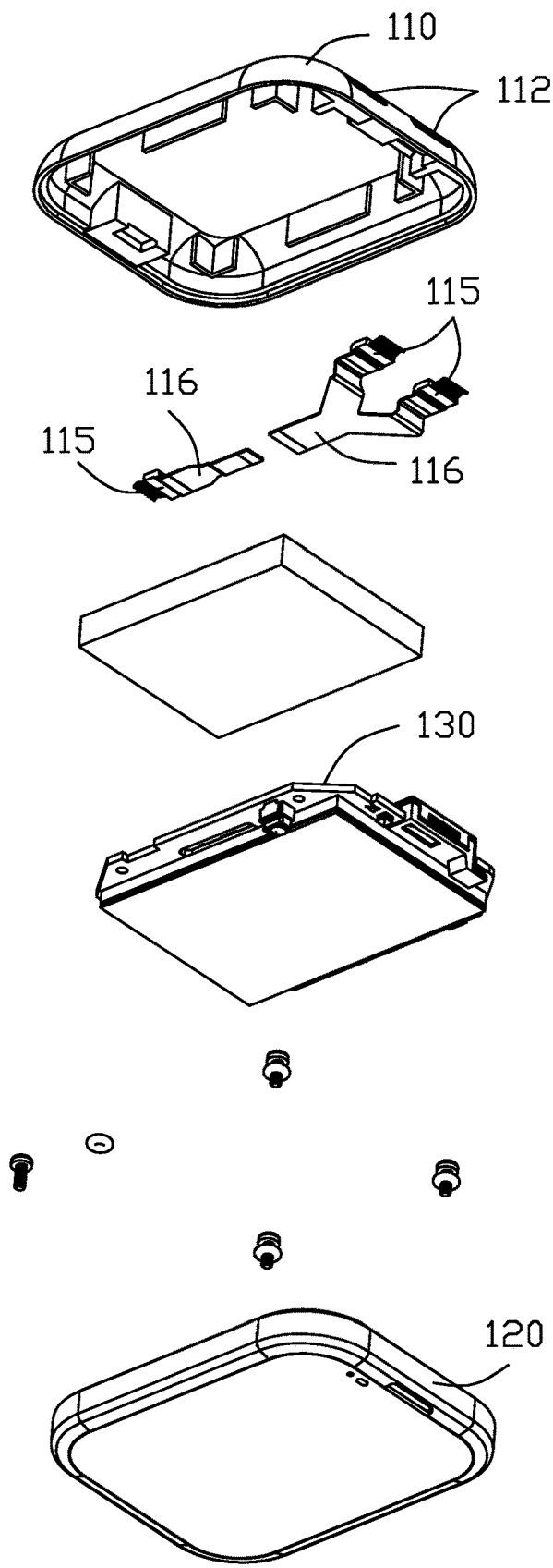
FIG. 7 is another exploded perspective view of the electrical connector of FIG. 6.
Figure 8:
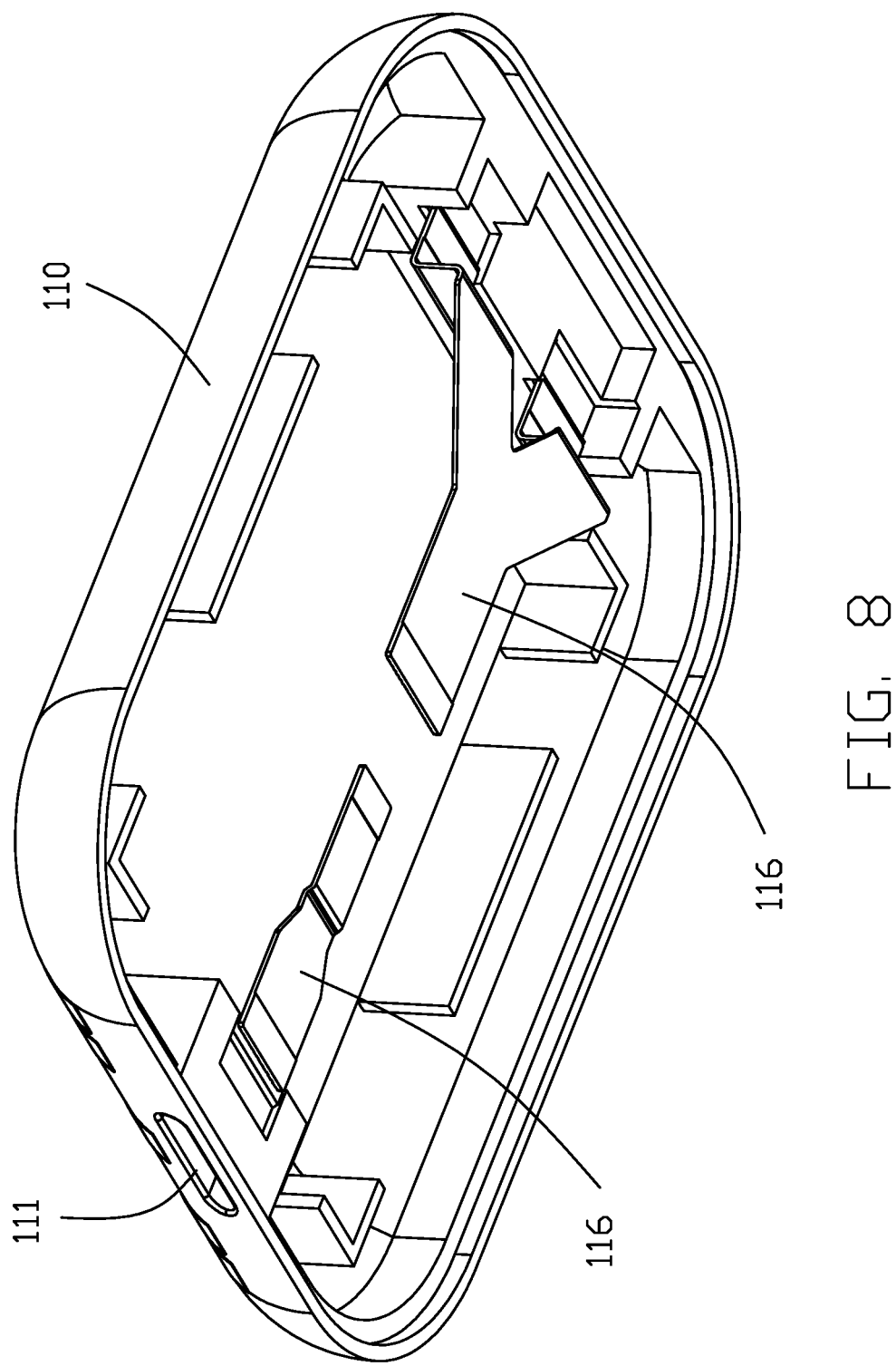
FIG. 8 is a perspective view of the top cover of the machine case with the corresponding internal cable assemblies of FIG. 7.
Figure 9:
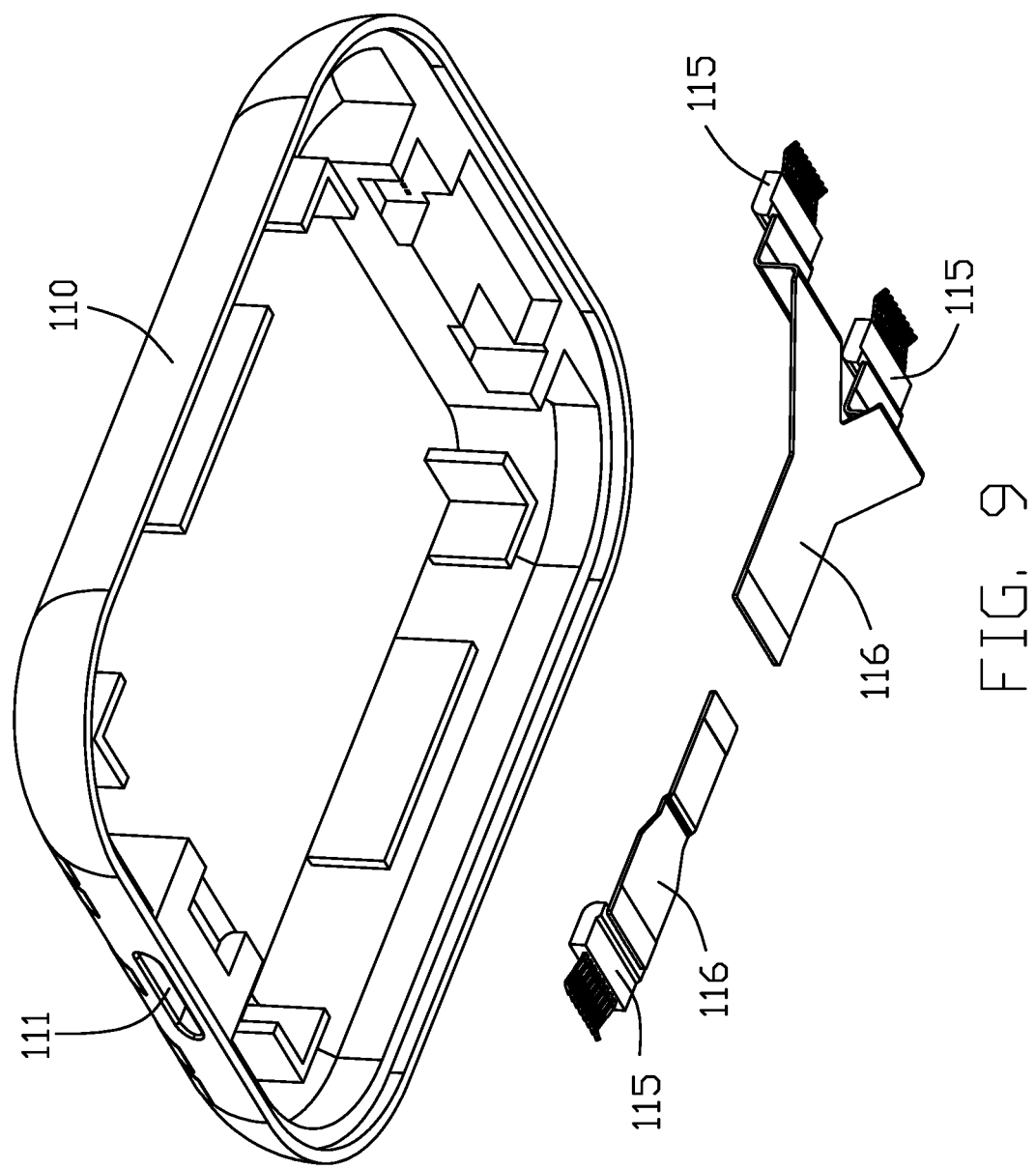
FIG. 9 is an exploded perspective view of the top cover and the machine case with the corresponding internal cable assemblies of FIG. 8.
Figure 10:
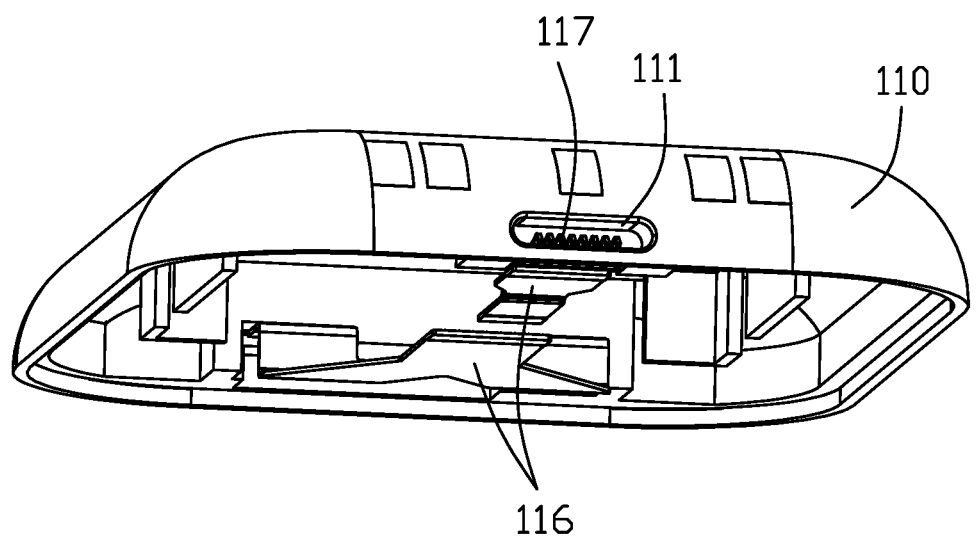
FIG. 10 is another exploded perspective view of the top cover and the machine case with the corresponding internal cable assemblies of FIG. 8.
Figure 11:
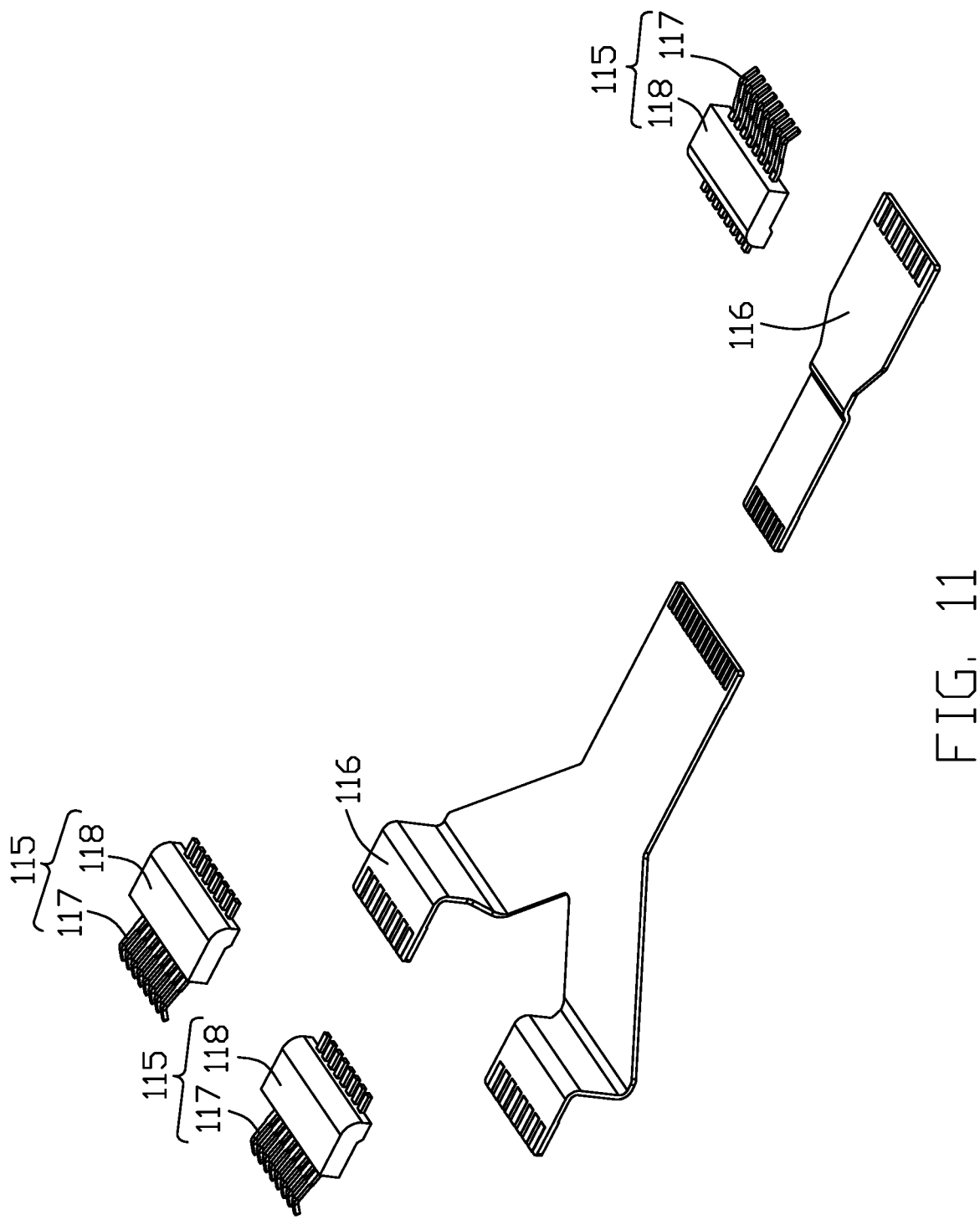
FIG. 11 is an exploded perspective view of the internal cable assemblies of FIG. 8.
Figure 12:
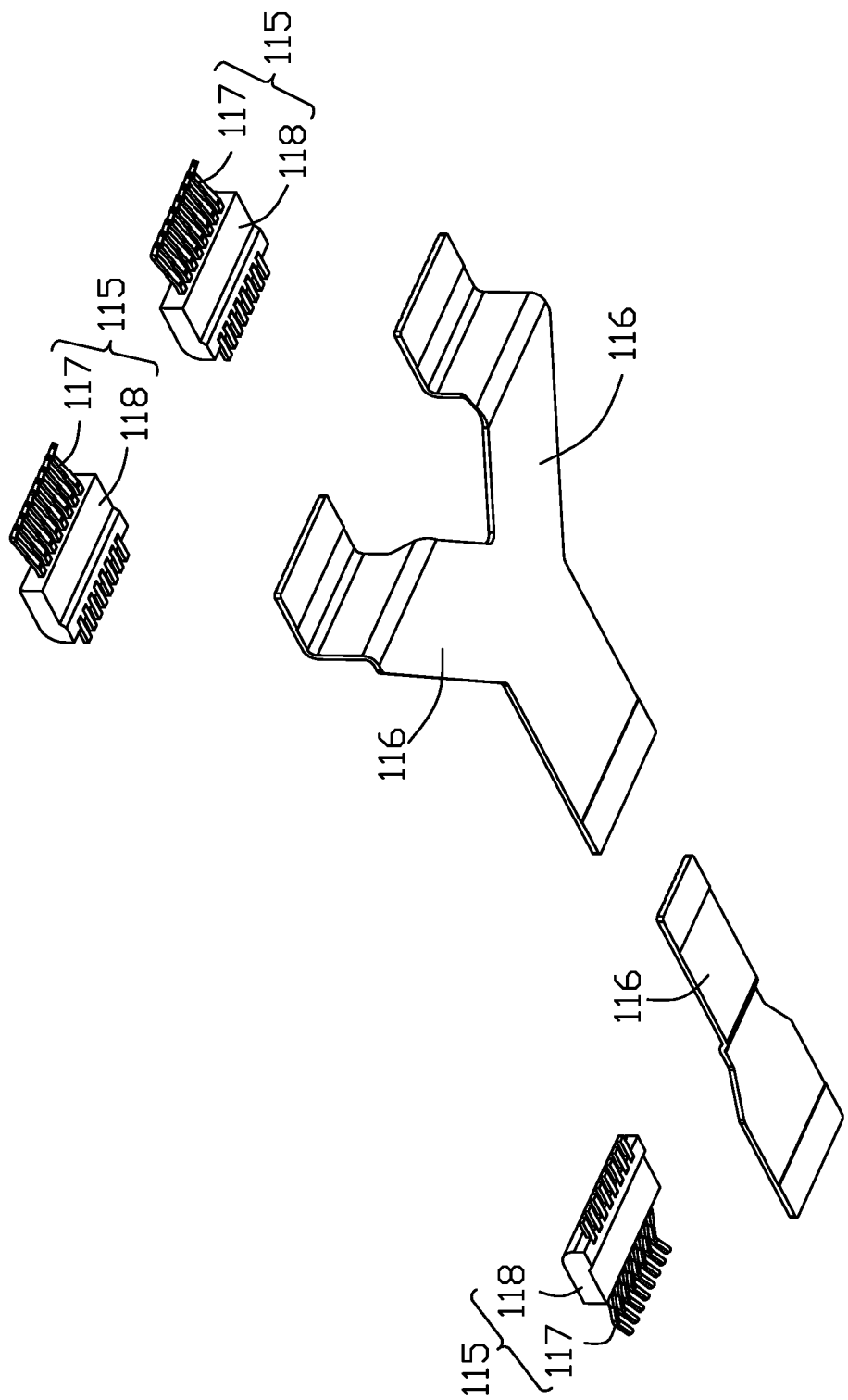
FIG. 12 is another exploded perspective view of the internal cable assemblies of FIG. 11.
Figure 13:
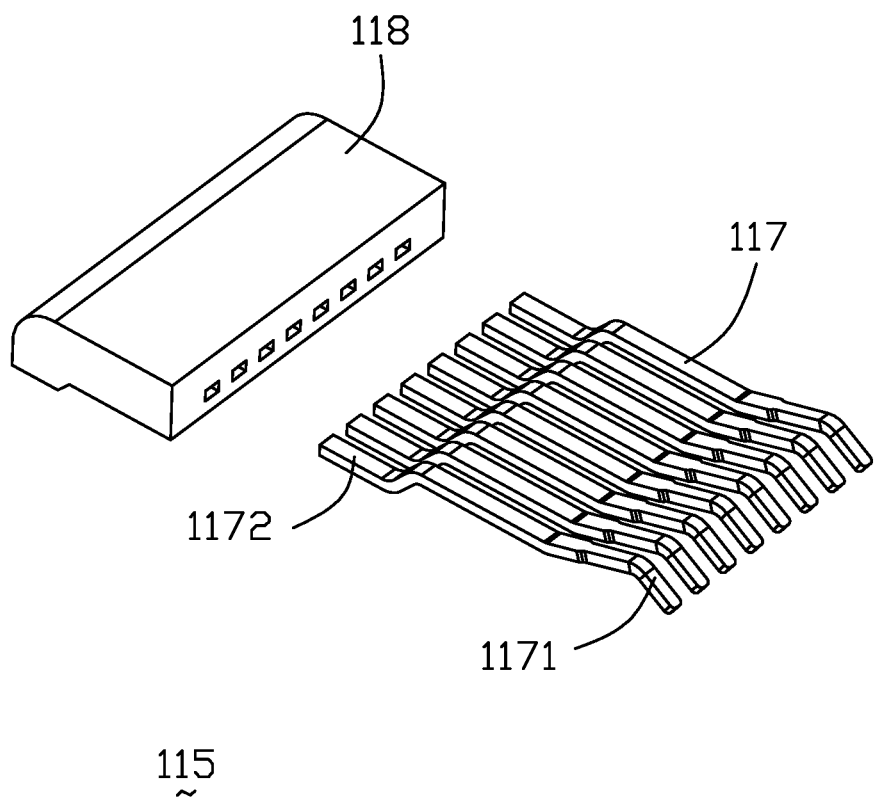
FIG. 13 is a further exploded perspective view of the electrical connector located at the front end of each of the internal cable assemblies of FIG. 11.
Figure 14:
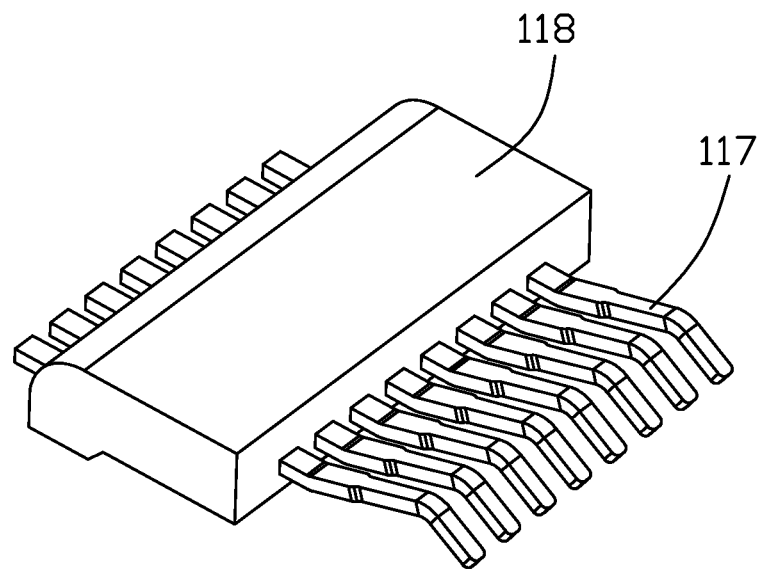
FIG. 14 is an assembled perspective view of the electrical connector of FIG. 13.
Figure 15:
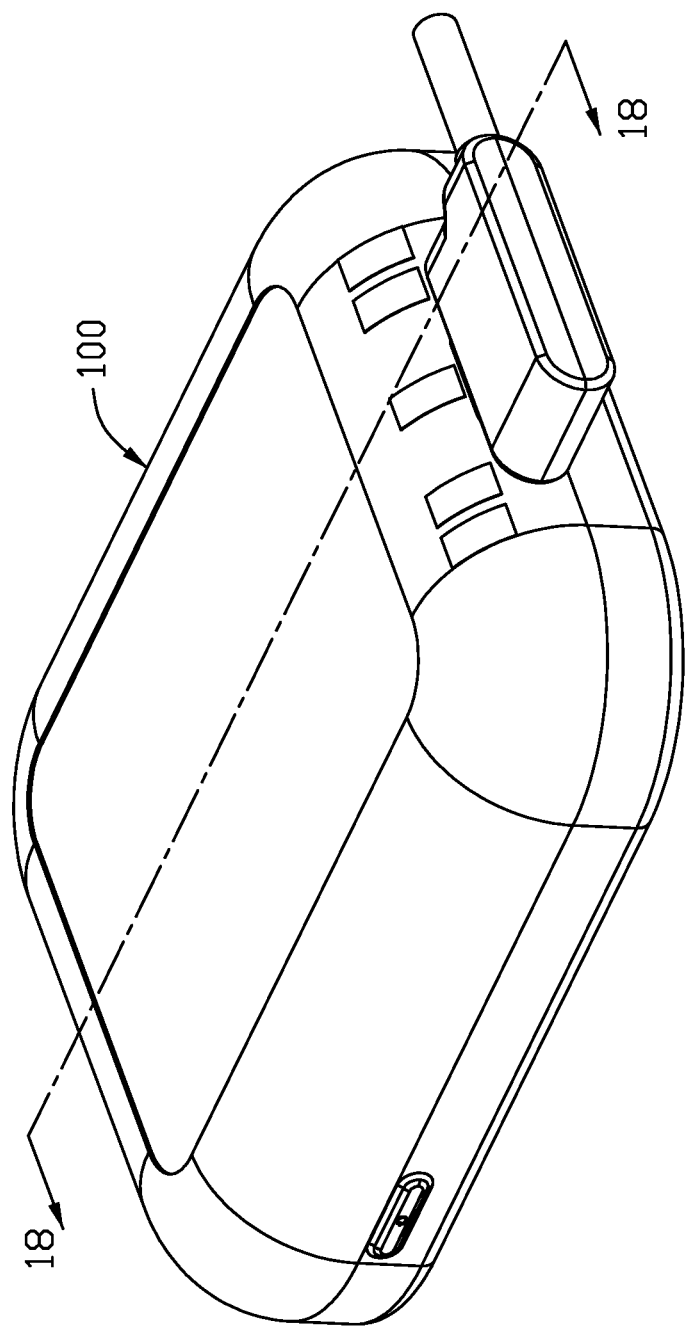
FIG. 15 is a perspective view of the machine case of FIG. 1 and a mateable cable connector assembly according to the invention, wherein the machine case is mated with the cable connector assembly.
Figure 16:
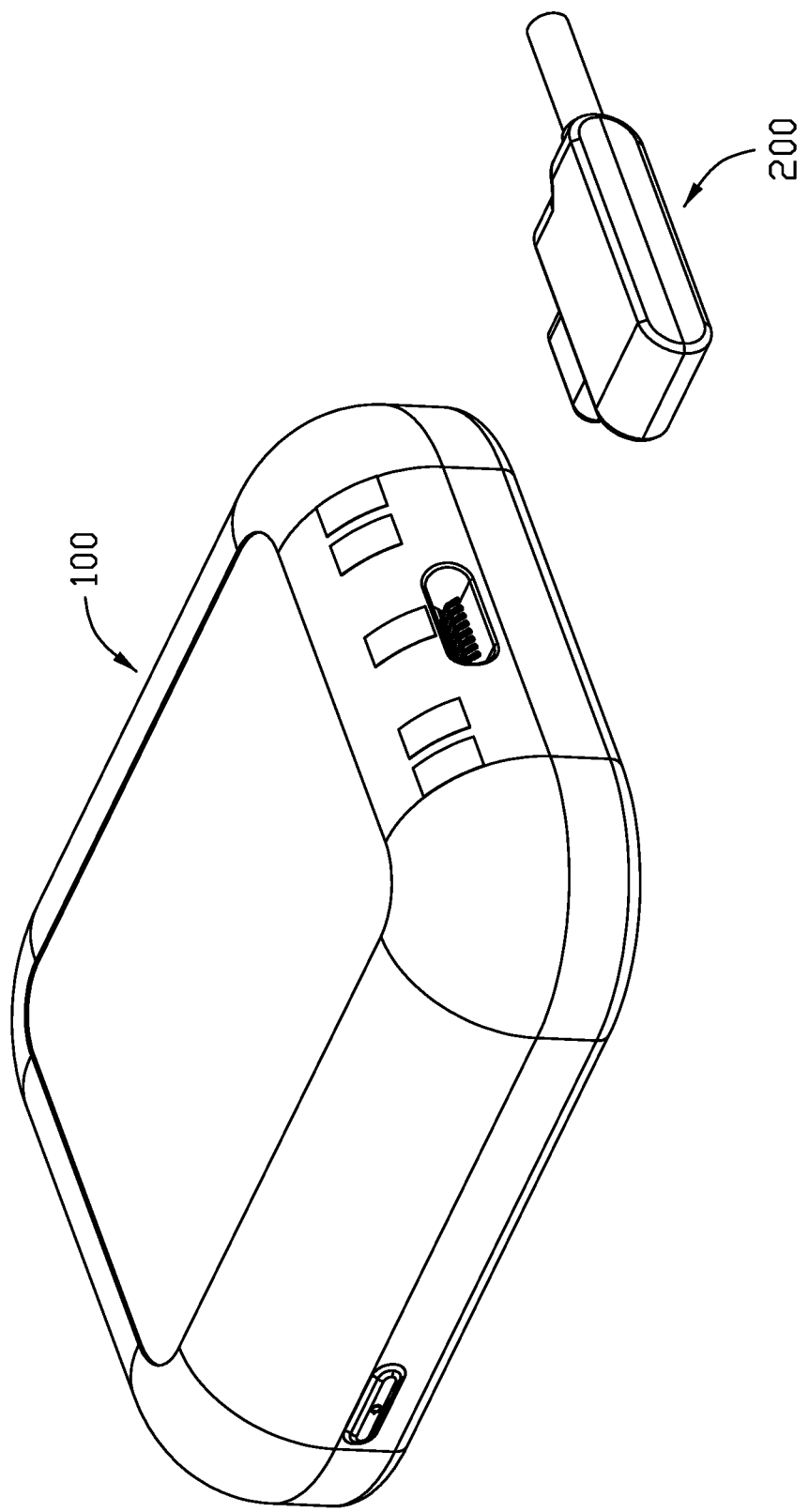
FIG. 16 is an exploded perspective view of the machine case and the mateable cable connector assembly of FIG. 15, wherein the machine case is un-mated with the cable connector assembly.
Figure 17:
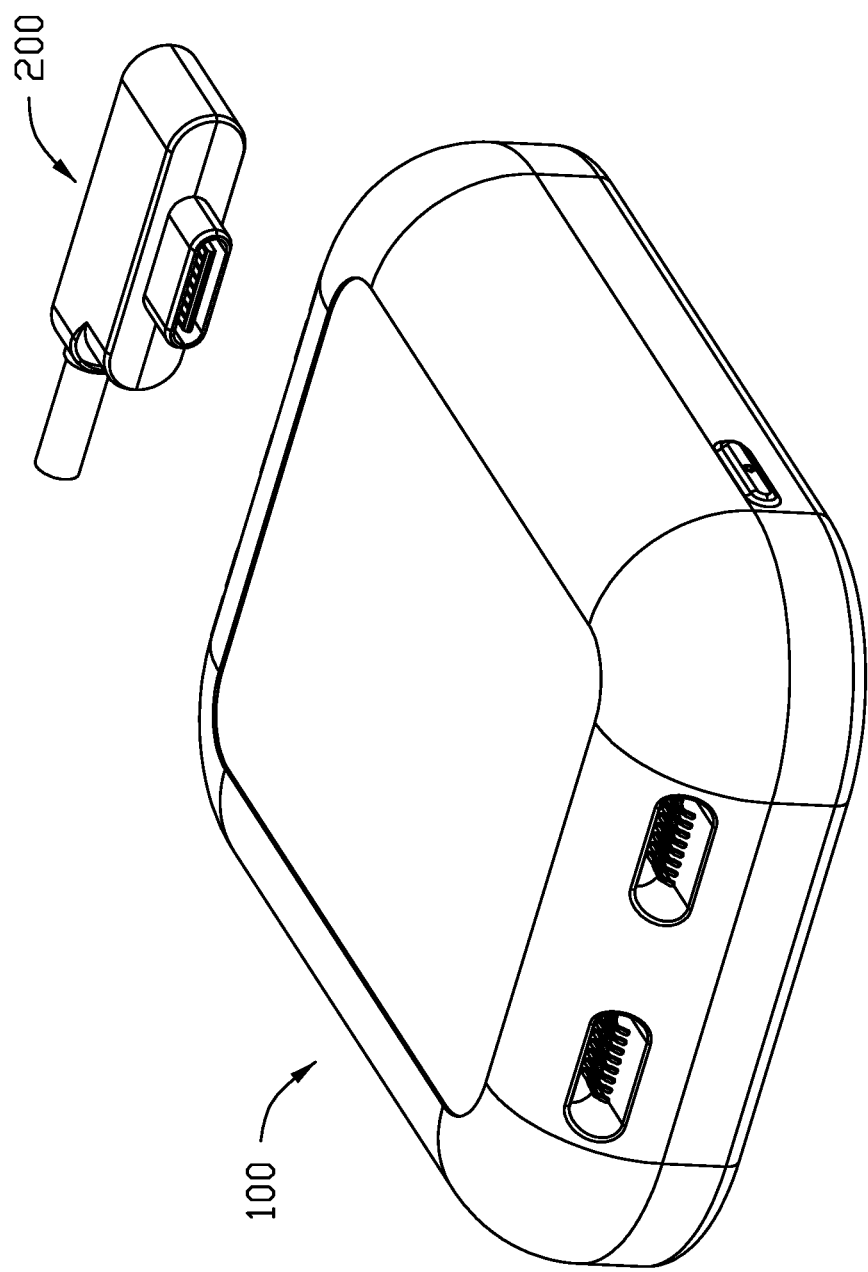
FIG. 17 is another exploded perspective view of the machine case and the mateable cable connector assembly of FIG. 16.
Figure 18:
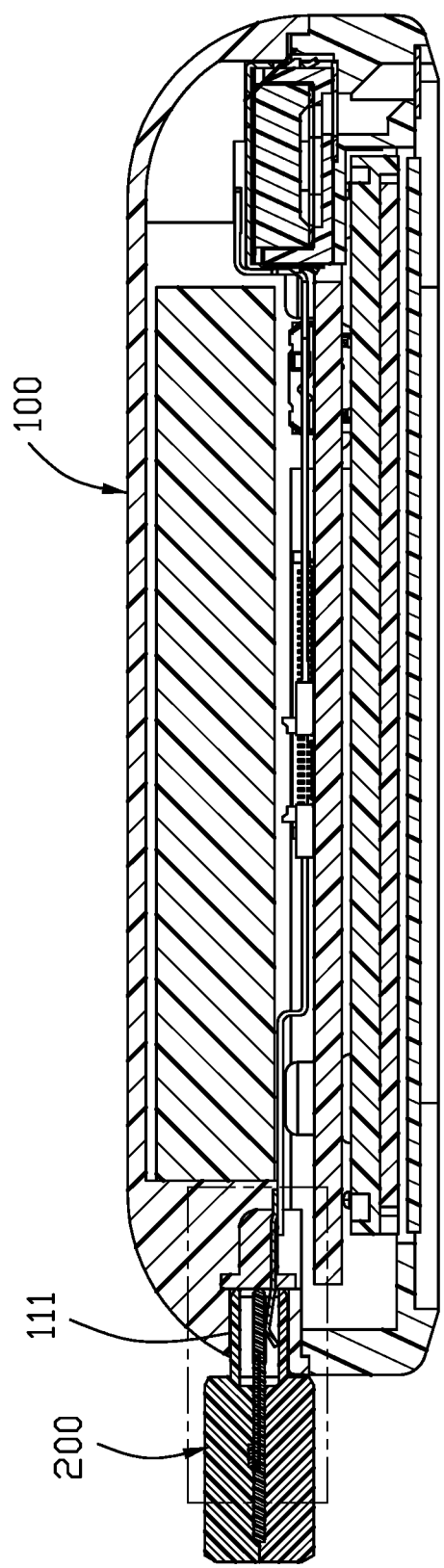
FIG. 18 is a cross-sectional view of the machine case and the mated cable connector assembly taken along broken lines 18-18 in FIG. 15.

Referring to FIGS. 1-14, a machine case 100 includes a top cover 110 and a bottom cover 120 commonly forming a space therein. An internal printed circuit board 130 is secured to the bottom cover 120. A first connection port 111, and a pair of second connection ports 112 are located at two opposite ends of the top cover 110. A first set of connectors 113 are electrically and mechanically connected to the printed circuit board 130 around a peripheral edge. A second set of connectors 114 are electrically and mechanically connected to printed circuit board 130 around a center region. A third set of connectors 115 are disposed around the connection ports 111, 112 without directly connecting to the printed circuit board 130. Instead, the third set of connectors 115 are electrically connected to the corresponding second set of connectors 114 via corresponding internal FPC (Flexible Printed Circuit) cables 116. Understandably, each of the second set of connectors 114 is the FPC connector for detachably holding the FPC cable 116 therein.

Each of the third set of connectors 115 includes a plurality of contacts 117 integrally formed within an insulator 118 via insert-molding. Each contact 117 includes a resilient contacting section 1171 for mating an external cable connector assembly 200 (illustrated later) and a solder tail 1172. The FPC cable 116 is further attached to solder tails 1172 of the contacts 117 to form an internal cable assembly. Each of said third set of connectors 115 is further integrally formed within the top cover 110 via another insert-molding process for waterproofing consideration. Notably, the top cover 110 may be preformed via an initial injection molding to form the primary structure while leaving a vacant space around the connection ports 111, 112, and the third set of connectors 115 are further molded upon such a primary structure to form the corresponding connection ports 111, 112 with the required waterproofing function. One of the first set of connectors 113 is the switch connector which is operable by a pressor exposed to an exterior and located in the bottom cover 120. The machine case 100 may further encloses the battery unit and the module unit therein as shown in the figures.

Figure 19:
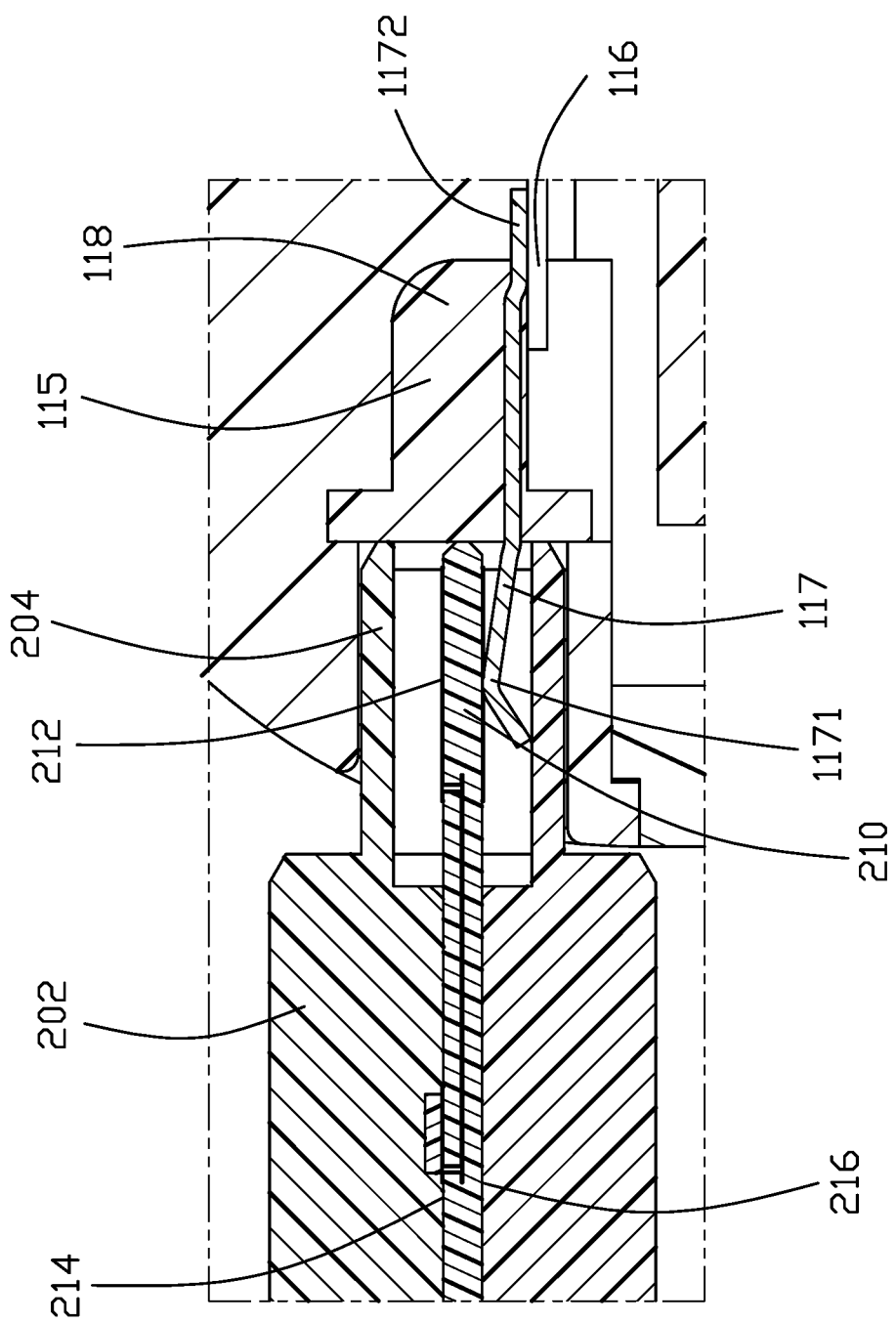
FIG. 19 is an enlarged cross-sectional view of a portion of the machine case and the mated cable connector assembly of FIG. 18.
Figure 20:
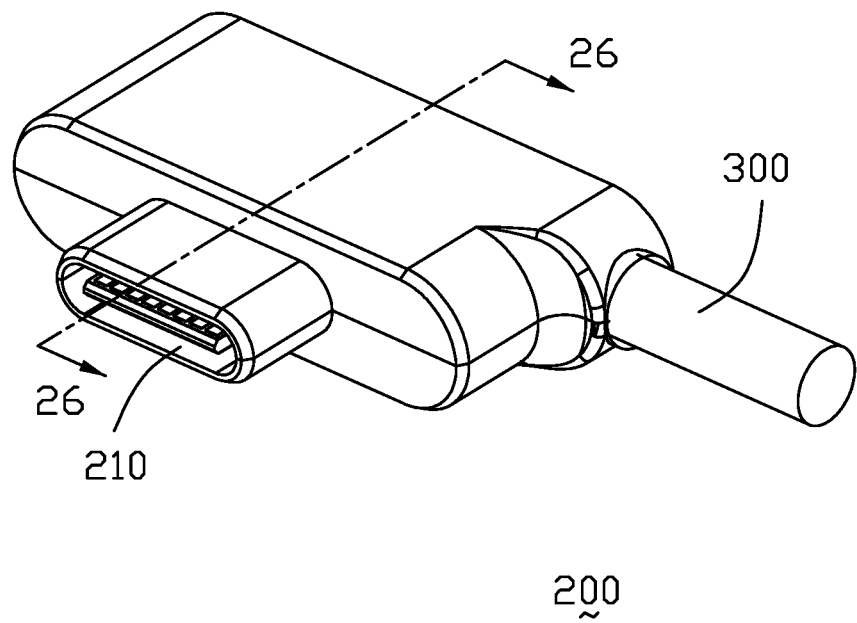
FIG. 20 is a perspective view of the cable connector assembly of FIG. 15.
Figure 21:
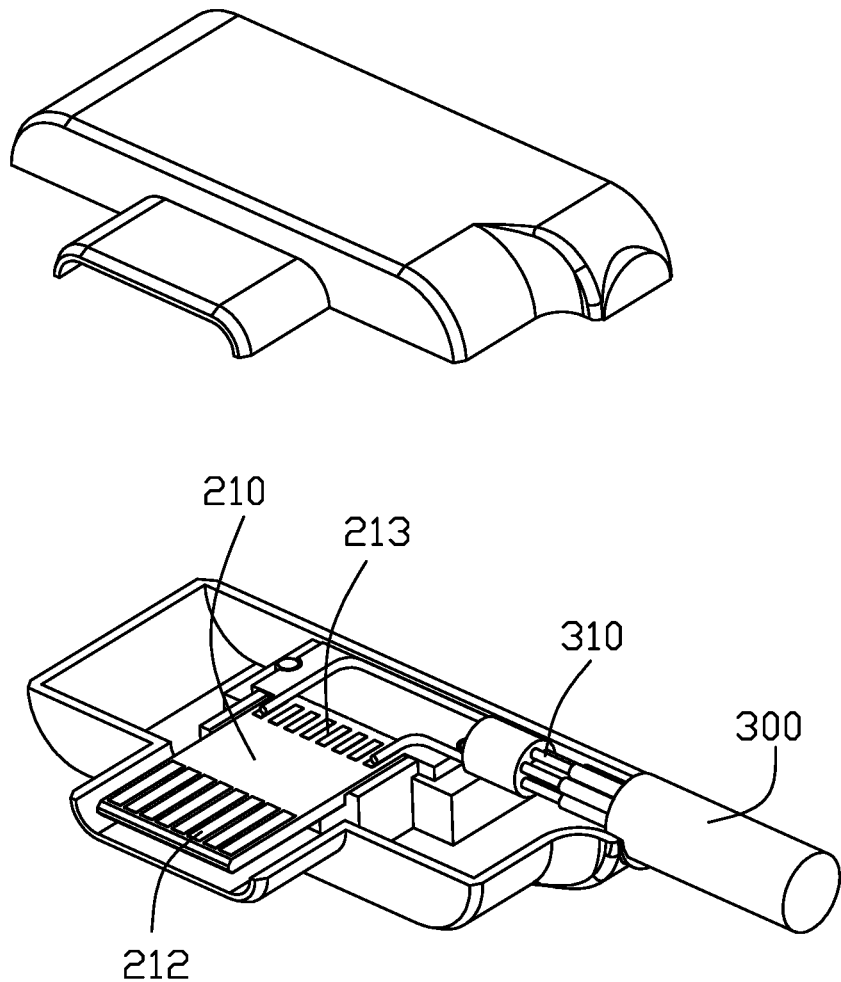
FIG. 21 is an exploded perspective view of the cable connector assembly of FIG. 20.
Figure 22:
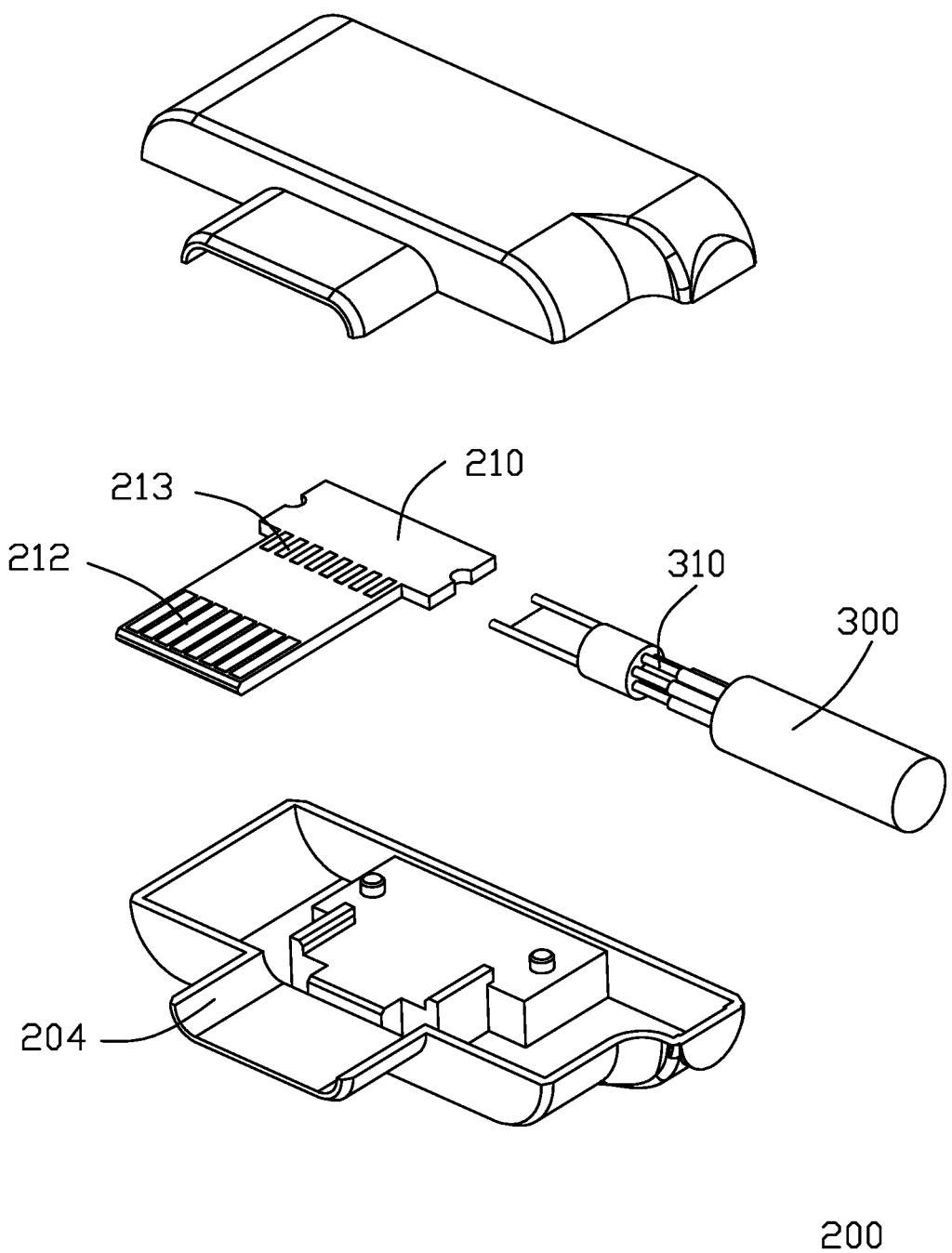
FIG. 22 is a further exploded perspective view of the cable connector assembly of FIG. 21.
Figure 23:
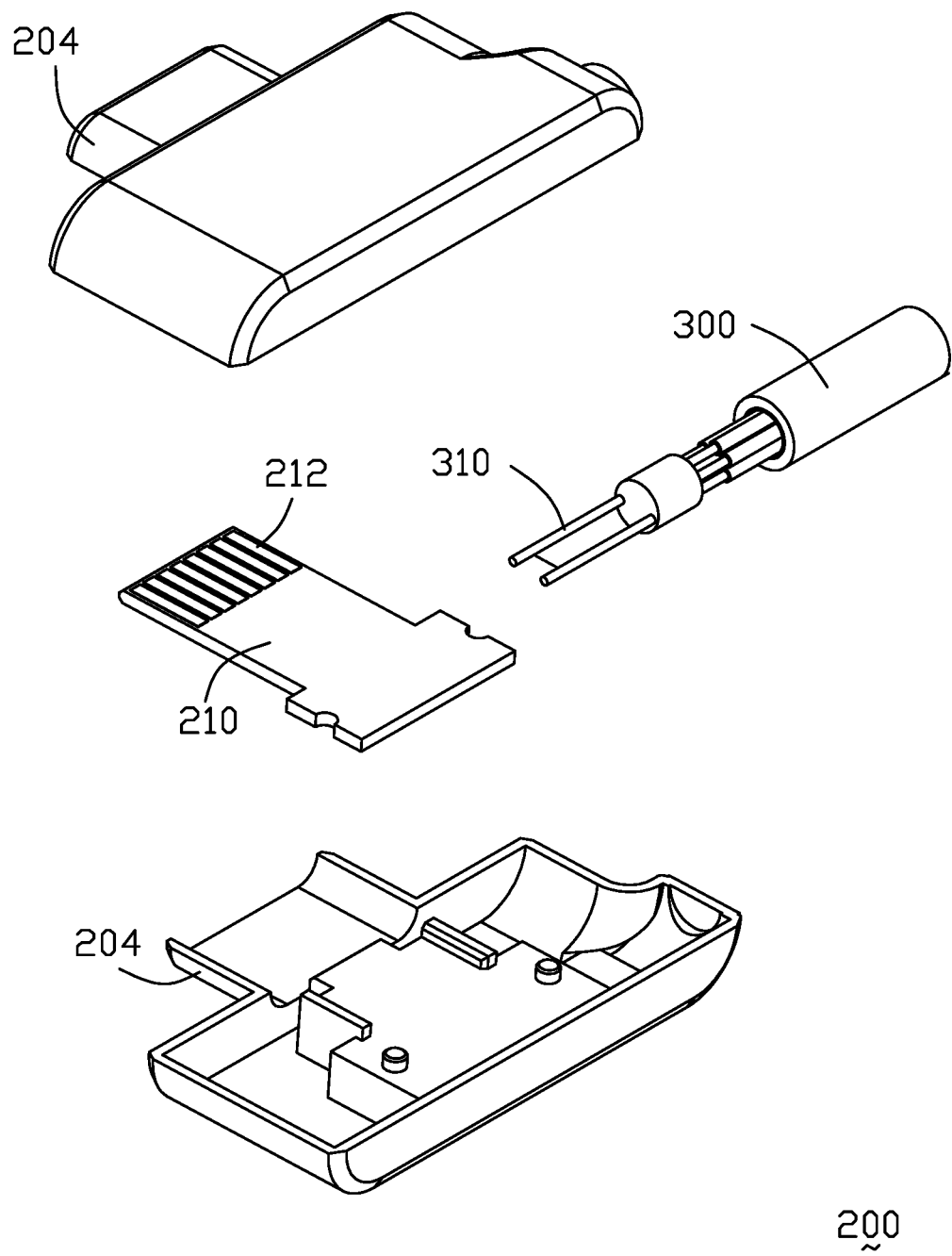
FIG. 23 is another exploded perspective view of the cable connector assembly of FIG. 22.
Figure 24:
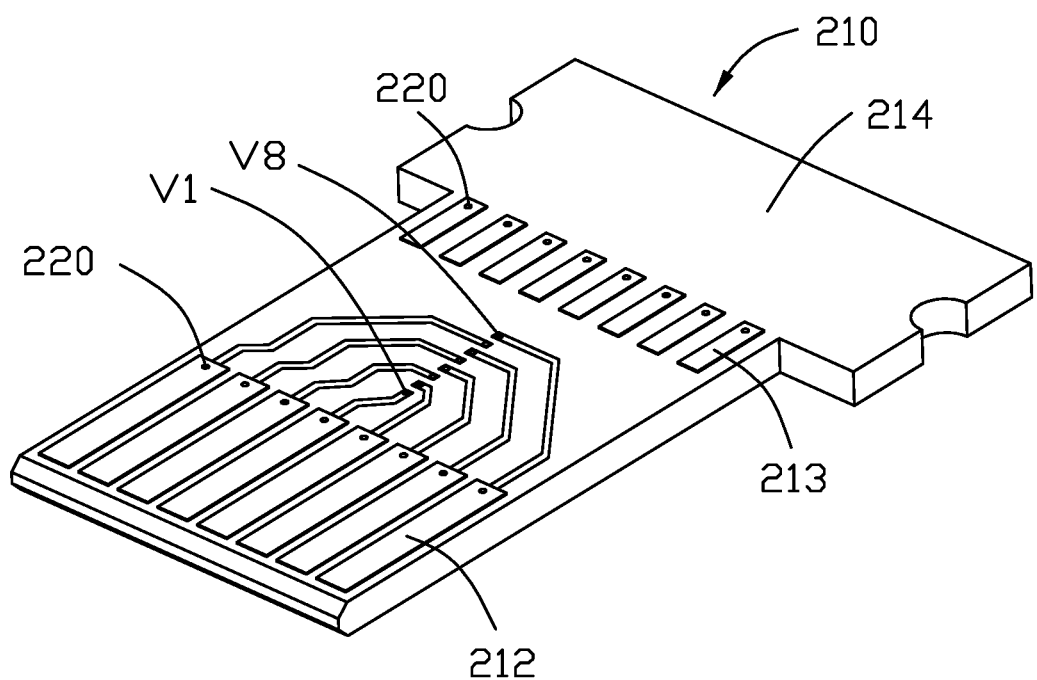
FIG. 24 is a perspective view of the internal mating printed circuit board of the cable connector assembly of FIG. 15.
Figure 25:
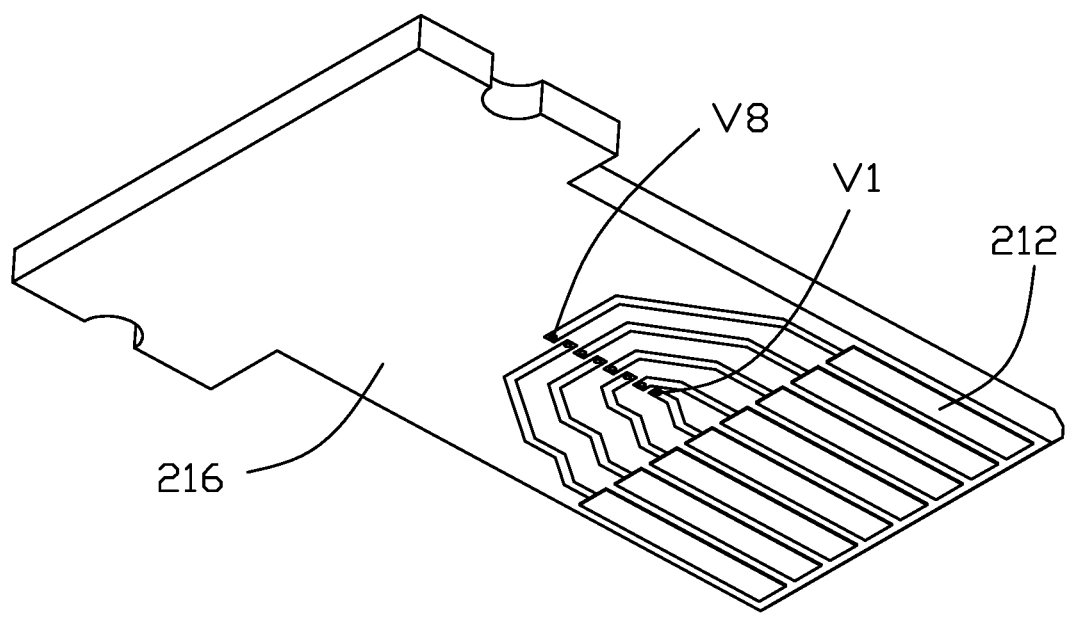
FIG. 25 is another perspective view of the internal mating printed circuit board of the cable connector assembly of FIG. 24.

Referring to FIGS. 15-25, the cable connector assembly 200 adapted to be mated with the machine case 100 includes an insulative housing 202 having a mating port 204 adapted to be mated with the connection port 111. An internal mating printed circuit board 210 is embedded within the housing 202 and forms mating pads 212 exposed in the mating port 204 and located on two opposite surfaces 214, 216 in a transversely reversely symmetrical manner so as to have the two corresponding mating pads 212 on two opposite surfaces 214, 216 in the diagonal direction share the same transmission circuits. Therefore, the mating port 204 of the cable connector assembly 200 is adapted to be mated with the corresponding connection port 111 in a flappable way conveniently. As shown in FIG. 19, the mating port 204 is received within the connection port 111, and the contacting section 1171 is received within the mating port 204 to contact the corresponding mating pad 212. Clearly, during mating, only the mating pads 212 on one of the opposite surfaces 214, 216 may contact the contacting sections 1171 for signal transmission.

Figure 26:
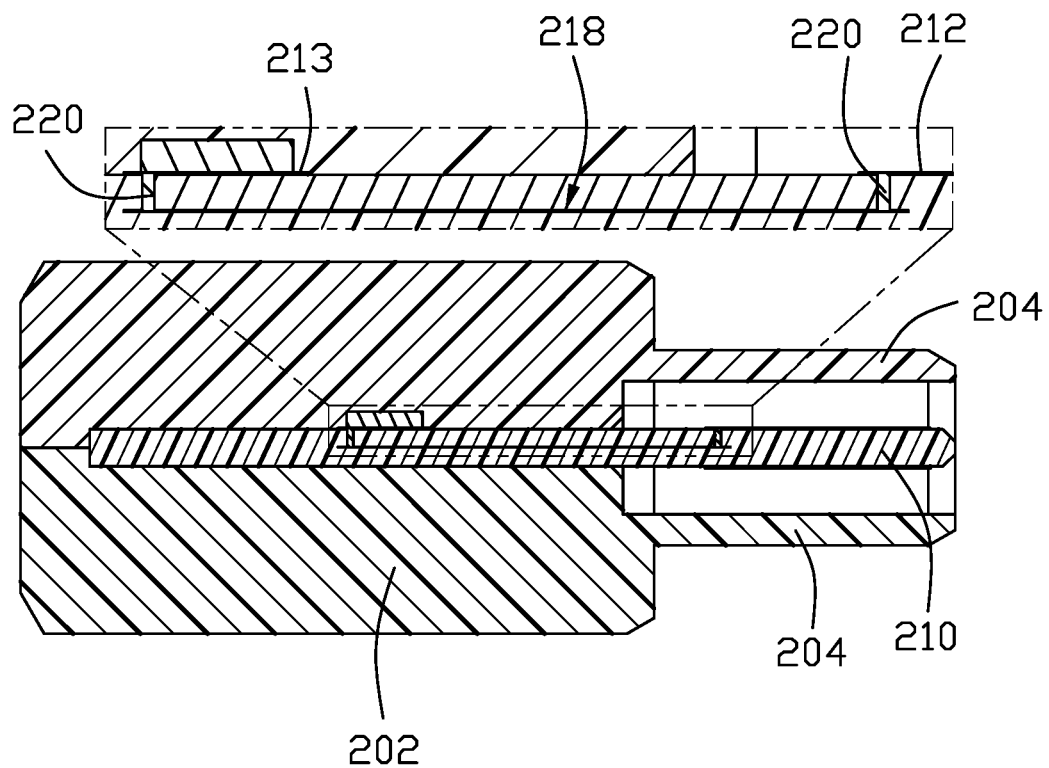
FIG. 26 is a cross-sectional view of the cable connector assembly taken along broken lines 26-26 in FIG. 20.
Figure 28:
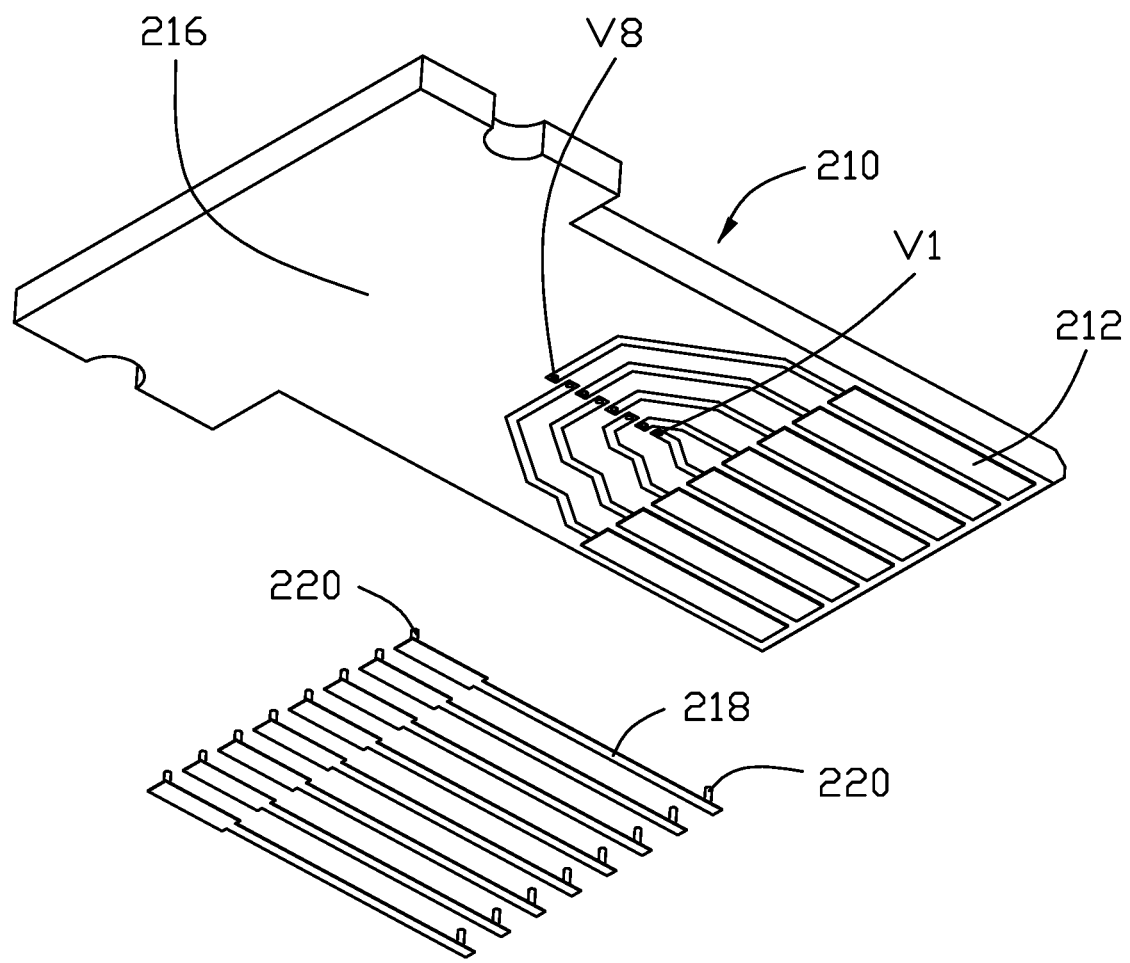
FIG. 28 is another exploded perspective view of the mating printed circuit board of the cable connector assembly of FIG. 27.

As shown in FIGS. 26-28, the internal mating printed circuit board 210 includes a plurality of transmission layer units 218 each electrically connected between two front mating pads 212 and one (rear) connecting pads 213, which are electrically connected to the wires 310 of the cable 300 of the cable connector assembly 200, by plated vias 220 wherein one front mating pad 212 on the left side of the surface 214 and another front mating pad 212 on the right side of the surface 216 are electrically connected to the same transmission layer unit 218 by the corresponding vias 220, thus resulting in mating in two orientations, i.e., the flappable way, with the same effect. In detail, there are, along a centerline extending in the front-to-back direction, eight linking vias V1-V8, having one ends on the surface 214 connect the traces linked to mating pads 2121-2128 on the surface 214, and the other ends on the surface 216 connecting the traces linked to the mating pads 2121-2128 on the surface 216. The sequence of the numerals 1 to 8 start from the left side and end at the right side on either surface 214, 216.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A machine case comprising:
    a first cover and a second cover commonly forming a receiving space;
    at least two connection ports formed in the first cover to communicating with an exterior;
    an internal printed circuit board retained in the second cover;
    a plurality of first connectors mounted upon a center region of the printed circuit board; and
    a plurality of second connectors disposed in the corresponding connection ports, respectively, without directly connecting to the printed circuit board while indirectly connecting to the first connectors via corresponding internal cables, respectively.

2. The machine case as claimed in claim 1, further including a plurality of third connectors mounted upon a peripheral region of the printed circuit board, and wherein the second cover includes a pressor to operate one of the third connectors.

3. The machine case as claimed in claim 1, wherein each of the second connectors includes a plurality of contacts retained to an insulator via an insert-molding process for assuring waterproofing between the insulator and the contacts, and the insulator is further integrally molded with the first cover via another insert-molding process for assuring waterproofing between the first cover and the insulator.

4. The machine case as claimed in claim 3, wherein the internal cables are soldered to the corresponding contact tails of the contacts.

5. The machine case as claimed in claim 3, wherein the contacts comprise corresponding deflectable contacting sections moveable within the connection port.

6. The machine case as claimed in claim 1, wherein the connection ports include a first connection port and a pair of second connection ports which are located at two opposite ends of the first cover.

7. A cable connector assembly adapted for mating with a machine case, the cable connector assembly comprising:
an insulative housing;
an internal mating printed circuit board retained in the insulative housing and including front mating pads on both opposite first and second surfaces, and rear connecting pads on at least one of said surfaces; and
a plurality of transmission layer units formed within the internal mating printed circuit board; wherein
the front mating pads on the first surface are transversely reversely symmetrical with regard to those on the second surface and commonly electrically connected to the same connecting pads, respectively, via same respective transmission layer units.

8. The cable connector assembly as claimed in claim 7, wherein the internal mating printed circuit board further includes a plurality of linking vias with first ends located on the first surface to connect to corresponding traces extending from the mating pads on the first surface, and second ends located on the second surface to connect to corresponding traces extending from the mating pads on the second surface.

9. The cable connector assembly as claimed in claim 8, wherein the linking vias are arranged in one line extending along a centerline along the front-to-back direction.

10. A machine case comprising:
a cover commonly forming an internal receiving space and a connector port communicating with an exterior;
an internal printed circuit board retained in the internal receiving space; and
an internal flat cable with a first connector at one end of the internal flat cable and mounted upon a center region of the printed circuit board, and a second connector at another end of the internal flat cable;
wherein the second connector is disposed in the connection port, the second connector including a plurality of contacts retained to an insulator via an insert-molding process for assuring waterproofing between the insulator and the contacts, the insulator being retained in the cover, each contact comprising a contacting section disposed in the connecting port and a tail section soldered with the internal flat cables.

11. The machine case as claimed in claim 10, wherein the connector port is formed to receive a flappable external cable connector assembly.

12. The machine case as claimed in claim 11, wherein there are two internal flat cables, one of the two internal flat cables is equipped with one said first connector and one said second connector, and the other internal flat cable is equipped with one said first connector and two said second connectors.

* * * * *